United States Patent
Zeltser

(10) Patent No.: US 8,373,948 B2
(45) Date of Patent: Feb. 12, 2013

(54) TUNNEL MAGNETORESISTANCE (TMR) STRUCTURES WITH MGO BARRIER AND METHODS OF MAKING SAME

(75) Inventor: Alexander M. Zeltser, San Jose, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 1120 days.

(21) Appl. No.: 12/110,681

(22) Filed: Apr. 28, 2008

(65) Prior Publication Data

US 2009/0268351 A1    Oct. 29, 2009

(51) Int. Cl.
G11B 5/39    (2006.01)

(52) U.S. Cl. .................................... 360/324.2

(58) Field of Classification Search ............... 360/324.2
See application file for complete search history.

(56) References Cited

U.S. PATENT DOCUMENTS

| | | | |
|---|---|---|---|
| 6,215,696 B1 * | 4/2001 | Tsuge | 438/3 |
| 6,347,049 B1 * | 2/2002 | Childress et al. | 360/324.2 |
| 6,452,761 B1 * | 9/2002 | Carey et al. | 360/320 |
| 6,841,395 B2 | 1/2005 | Linn et al. | 438/3 |
| 7,239,489 B2 | 7/2007 | Lin et al. | 360/324.2 |
| 7,598,555 B1 * | 10/2009 | Papworth Parkin | 365/158 |
| 2002/0097534 A1 * | 7/2002 | Sun et al. | 360/324.2 |
| 2003/0021071 A1 * | 1/2003 | Kula et al. | 360/324.1 |
| 2003/0128483 A1 * | 7/2003 | Kamijo | 360/324.2 |
| 2004/0101978 A1 * | 5/2004 | Linn et al. | 438/3 |
| 2005/0047027 A1 * | 3/2005 | Lin | 360/324.1 |
| 2006/0221510 A1 * | 10/2006 | Parkin | 360/324.2 |
| 2007/0034954 A1 | 2/2007 | Cho et al. | 257/347 |
| 2007/0111332 A1 | 5/2007 | Zhao et al. | 438/3 |
| 2007/0139827 A1 | 6/2007 | Gao et al. | 360/324.2 |
| 2007/0148786 A1 | 6/2007 | Horng et al. | 438/2 |
| 2007/0155027 A1 | 7/2007 | Ditizio | 438/3 |
| 2007/0165337 A1 * | 7/2007 | Ide et al. | 360/324.2 |
| 2007/0178608 A1 * | 8/2007 | Sun et al. | 438/3 |
| 2008/0151439 A1 * | 6/2008 | Pinarbasi | 360/324.2 |
| 2008/0299679 A1 * | 12/2008 | Zhao et al. | 438/3 |
| 2009/0243007 A1 * | 10/2009 | Buttet et al. | 438/3 |
| 2009/0246557 A1 * | 10/2009 | Horng et al. | 428/811.1 |
| 2009/0257151 A1 * | 10/2009 | Zhang et al. | 360/324.2 |

OTHER PUBLICATIONS

U.S. Appl. No. 11/219,107, filed Sep. 1, 2005 to Zeltzer et al.

* cited by examiner

*Primary Examiner* — Craig A. Renner
(74) *Attorney, Agent, or Firm* — Zilka-Kotab, PC

(57) ABSTRACT

A method in one embodiment includes forming a first layer of magnesium above at least one of a free layer and a reference layer; exposing the first layer of magnesium to an oxidizing environment for causing oxidation of the first layer of magnesium; forming a second layer of magnesium above the oxidized first layer of magnesium; and exposing the second layer of magnesium to the oxidizing environment for causing oxidation of the second layer of magnesium. A system in one embodiment includes a free layer; and a tunnel barrier layer having microstructure and composition characteristic of in situ natural oxidation of magnesium. Additional systems and methods are also presented.

22 Claims, 10 Drawing Sheets

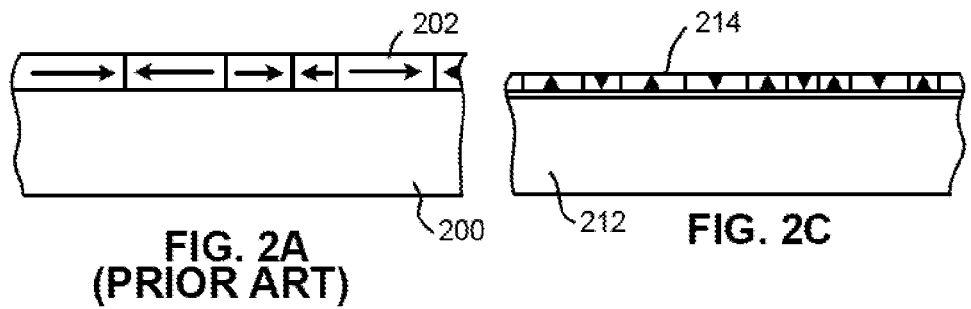
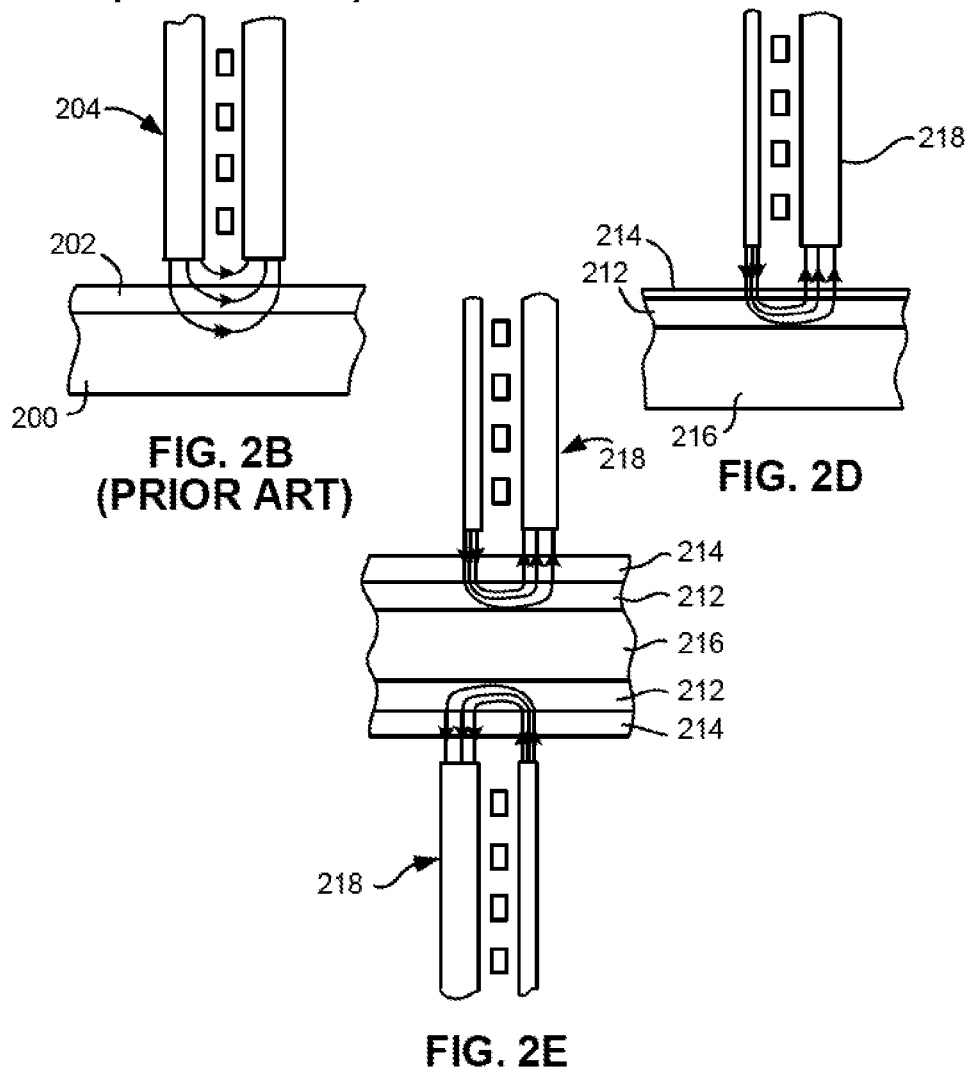
FIG. 2A (PRIOR ART)
FIG. 2B (PRIOR ART)
FIG. 2C
FIG. 2D
FIG. 2E

TUNNEL MAGNETORESISTANCE (TMR) STRUCTURES WITH MGO BARRIER AND METHODS OF MAKING SAME

FIELD OF THE INVENTION

The present invention relates to thin film sensor structures and methods of making, and more particularly, this invention relates to tunnel magnetoresistance (TMR) structures.

BACKGROUND OF THE INVENTION

The heart of a computer is a magnetic disk drive which typically includes a rotating magnetic disk, a slider that has read and write heads, a suspension arm above the rotating disk and an actuator arm that swings the suspension arm to place the read and/or write heads over selected circular tracks on the rotating disk. The suspension arm biases the slider into contact with the surface of the disk when the disk is not rotating but, when the disk rotates, air is swirled by the rotating disk adjacent an air bearing surface (ABS) of the slider causing the slider to ride on an air bearing a slight distance from the surface of the rotating disk. When the slider rides on the air bearing the write and read heads are employed for writing magnetic impressions to and reading magnetic signal fields from the rotating disk. The read and write heads are connected to processing circuitry that operates according to a computer program to implement the writing and reading functions.

SUMMARY OF THE INVENTION

A method in one embodiment includes forming a first layer of magnesium above at least one of a free layer and a reference layer; exposing the first layer of magnesium to an oxidizing environment for causing oxidation of the first layer of magnesium; forming a second layer of magnesium above the oxidized first layer of magnesium; and exposing the second layer of magnesium to the oxidizing environment for causing oxidation of the second layer of magnesium.

A method in another embodiment includes forming a layer of magnesium above at least one of a free layer and a reference layer; exposing the layer of magnesium to an oxidizing environment for causing oxidation of the first layer of magnesium; and forming a layer of magnesium oxide above the at least one of the free layer and the reference layer by reactive deposition.

A system in one embodiment includes a free layer; and a tunnel barrier layer having microstructure and composition characteristic of in situ natural oxidation of magnesium.

A system in another embodiment includes magnetic media; at least one head for reading from and writing to the magnetic media, each head having: a sensor comprising a free layer; and a tunnel barrier layer having microstructure and composition characteristic of in situ natural oxidation of magnesium. A writer is coupled to the sensor. The system further includes a slider for supporting the head, and a control unit coupled to the head for controlling operation of the head.

Other aspects, advantages and embodiments of the present invention will become apparent from the following detailed description, which, when taken in conjunction with the drawings, illustrate by way of example the principles of the invention.

BRIEF DESCRIPTION OF THE DRAWINGS

For a fuller understanding of the nature and advantages of the present invention, as well as the preferred mode of use, reference should be made to the following detailed description read in conjunction with the accompanying drawings.

FIG. 2A is a schematic representation in section of a recording medium utilizing a longitudinal recording format.

FIG. 2B is a schematic representation of a conventional magnetic recording head and recording medium combination for longitudinal recording as in FIG. 1.

FIG. 2C is a magnetic recording medium utilizing a perpendicular recording format.

FIG. 2D is a schematic representation of a recording head and recording medium combination for perpendicular recording on one side.

FIG. 2E is a schematic representation of the recording apparatus in accordance with one embodiment, similar to that of FIG. 2D, but adapted for recording separately on both sides of the medium.

DETAILED DESCRIPTION

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified.

The following description discloses several preferred embodiments of thin film TMR sensors, as well as magnetic storage systems implementing the same and methods of fabrication.

In one general embodiment, a method comprises forming multiple layers of magnesium above a free layer (for a top tunnel valve) or a reference layer (for a bottom tunnel valve); and after forming each layer, exposing the layer of magnesium to an oxidizing environment for causing oxidation of the layers of magnesium.

In another general embodiment, a method comprises forming a first layer of magnesium above at least one of a free layer and a reference layer; exposing the first layer of magnesium to an oxidizing environment for causing oxidation of the first layer of magnesium; forming a second layer of magnesium above the oxidized first layer of magnesium; and exposing the second layer of magnesium to the oxidizing environment for causing oxidation of the second layer of magnesium.

In another general embodiment, a method comprises forming a layer of magnesium above at least one of a free layer and a reference layer; exposing the layer of magnesium to an oxidizing environment for causing oxidation of the first layer of magnesium; and forming a layer of magnesium oxide above the at least one of the free layer and the reference layer by reactive deposition.

In another general embodiment, a system comprises a free layer; and a tunnel barrier layer having microstructure and composition of magnesium oxide arranged with respect to one another as characteristic of in situ natural oxidation of magnesium.

Figure 1:
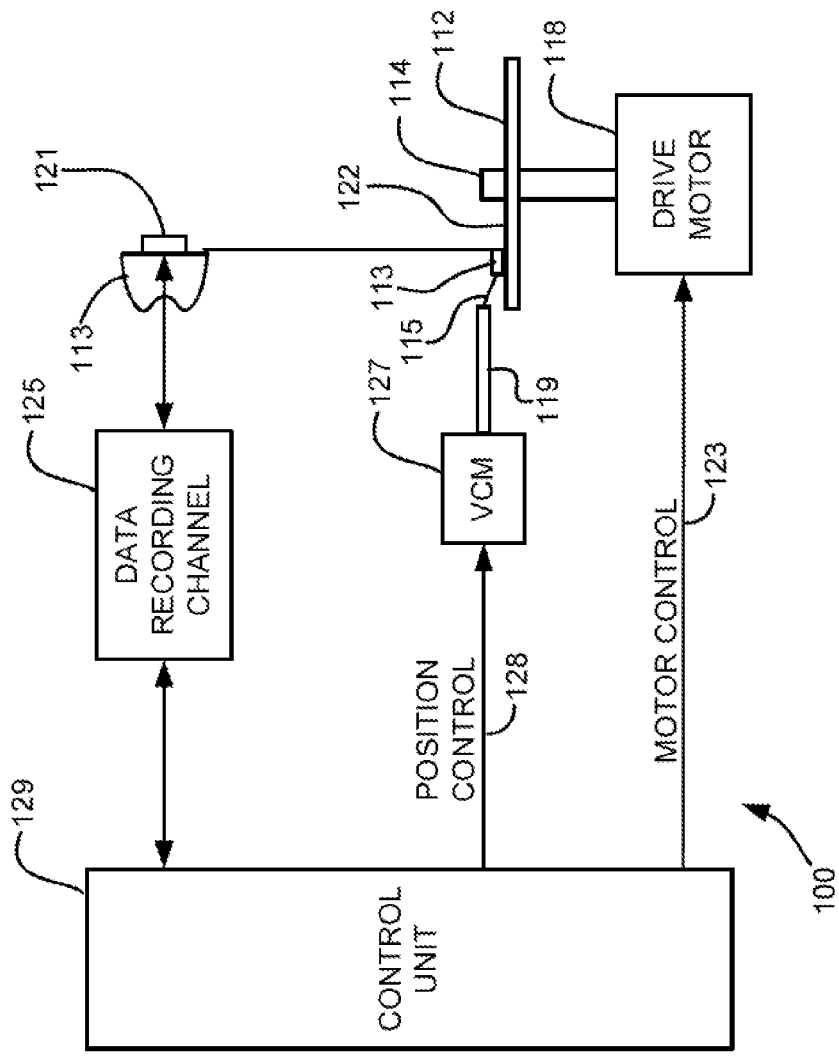
FIG. 1 is a simplified drawing of a magnetic recording disk drive system.

Referring now to FIG. 1, there is shown a disk drive 100 in accordance with one embodiment of the present invention. As shown in FIG. 1, at least one rotatable magnetic disk 112 is supported on a spindle 114 and rotated by a disk drive motor 118. The magnetic recording on each disk is in the form of an annular pattern of concentric data tracks (not shown) on the disk 112.

At least one slider 113 is positioned near the disk 112, each slider 113 supporting one or more magnetic read/write heads 121. As the disks rotate, slider 113 is moved radially in and out over disk surface 122 so that heads 121 may access different tracks of the disk where desired data are recorded. Each slider 113 is attached to an actuator arm 119 by means of a suspension 115. The suspension 115 provides a slight spring force which biases slider 113 against the disk surface 122. Each actuator arm 119 is attached to an actuator means 127 as shown in FIG. 1 may be a voice coil motor (VCM). The VCM comprises a coil movable within a fixed magnetic field, the direction and speed of the coil movements being controlled by the motor current signals supplied by controller 129.

During operation of the disk storage system, the rotation of disk 112 generates an air bearing between slider 113 and disk surface 122 which exerts an upward force or lift on the slider. The air bearing thus counter-balances the slight spring force of suspension 115 and supports slider 113 off and slightly above the disk surface by a small, substantially constant spacing during normal operation.

The various components of the disk storage system are controlled in operation by control signals generated by control unit 129, such as access control signals and internal clock signals. Typically, control unit 129 comprises logic control circuits, storage means and a microprocessor. The control unit 129 generates control signals to control various system operations such as drive motor control signals on line 123 and head position and seek control signals on line 128. The control signals on line 128 provide the desired current profiles to optimally move and position slider 113 to the desired data track on disk 112. Read and write signals are communicated to and from read/write heads 121 by way of recording channel 125.

The above description of a typical magnetic disk storage system, and the accompanying illustration of FIG. 1 are for representation purposes only. It should be apparent that disk storage systems may contain a large number of disks and actuators, and each actuator may support a number of sliders.

An interface may also be provided for communication between the disk drive and a host (integral or external) to send and receive the data and for controlling the operation of the disk drive and communicating the status of the disk drive to the host, all as will be understood by those of skill in the art.

In a typical head, an inductive write head includes a coil layer embedded in one or more insulation layers (insulation stack), the insulation stack being located between first and second pole piece layers. A gap is formed between the first and second pole piece layers by a gap layer at an air bearing surface (ABS) of the write head. The pole piece layers may be connected at a back gap. Currents are conducted through the coil layer, which produce magnetic fields in the pole pieces. The magnetic fields fringe across the gap at the ABS for the purpose of writing bits of magnetic field information in tracks on moving media, such as in circular tracks on a rotating magnetic disk. The second pole piece layer has a pole tip portion which extends from the ABS to a flare point and a yoke portion which extends from the flare point to the back gap. The flare point is where the second pole piece begins to widen (flare) to form the yoke. The placement of the flare point directly affects the magnitude of the magnetic field produced to write information on the recording medium. Since magnetic flux decays as it travels down the length of the narrow second pole tip, shortening the second pole tip will increase the flux reaching the recording media. Therefore, performance can be optimized by aggressively placing the flare point close to the ABS.

Figure 3A:
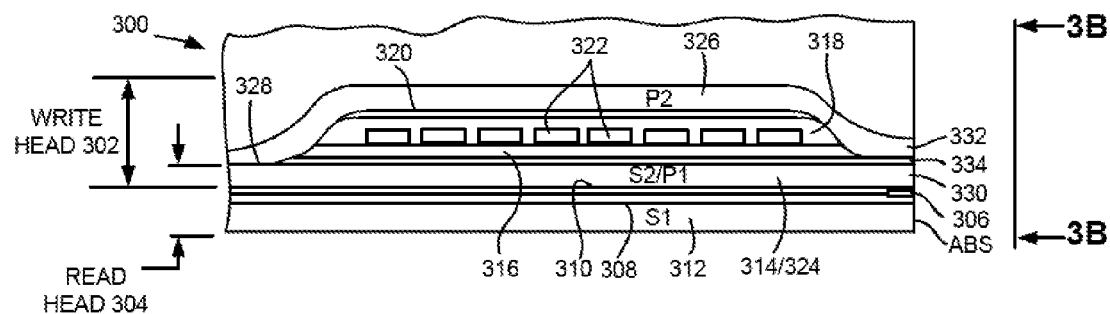
FIG. 3A is a partial view of a merged magnetic head.

FIG. 2A illustrates, schematically, a conventional recording medium such as used with conventional magnetic disc recording systems, such as that shown in FIG. 3A. This medium is utilized for recording magnetic impulses in or parallel to the plane of the medium itself. The recording medium, a recording disc in this instance, comprises basically a supporting substrate 200 of a suitable non-magnetic material such as glass, with an overlying coating 202 of a suitable and conventional magnetic layer.

FIG. 2B shows the operative relationship between a conventional recording/playback head 204, which may preferably be a thin film head, and a conventional recording medium, such as that of FIG. 2A.

FIG. 2C illustrates schematically the orientation of magnetic impulses substantially perpendicular to the surface of the recording medium. For such perpendicular recording the medium includes an under layer 212 of a material having a high magnetic permeability. This under layer 212 is then provided with an overlying coating 214 of magnetic material preferably having a high coercivity relative to the under layer 212.

Two embodiments of storage systems with perpendicular heads 218 are illustrated in FIGS. 2C and 2D (not drawn to scale). The recording medium illustrated in FIG. 2D includes both the high permeability under layer 212 and the overlying coating 214 of magnetic material described with respect to FIG. 2C above. However, both of these layers 212 and 214 are shown applied to a suitable substrate 216. Typically there is also an additional layer (not shown) called an "exchange-break" layer or "interlayer" between layers 212 and 214.

By this structure the magnetic lines of flux extending between the poles of the recording head loop into and out of the outer surface of the recording medium coating with the high permeability under layer of the recording medium causing the lines of flux to pass through the coating in a direction generally perpendicular to the surface of the medium to record information in the magnetically hard coating of the medium in the form of magnetic impulses having their axes of magnetization substantially perpendicular to the surface of the medium. The flux is channeled by the soft underlying coating 212 back to the return layer (P1) of the head 218.

FIG. 2E illustrates a similar structure in which the substrate 216 carries the layers 212 and 214 on each of its two opposed sides, with suitable recording heads 218 positioned adjacent the outer surface of the magnetic coating 214 on each side of the medium.

Figure 3B:
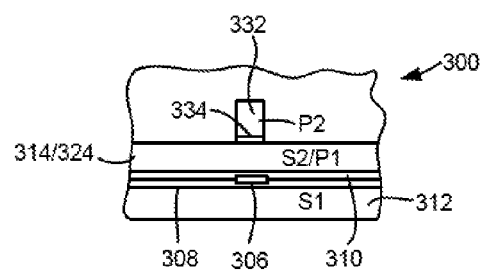
FIG. 3B is a partial ABS view, not to scale, of the slider taken along plane 3B-3B of FIG. 3A.

FIG. 3A is a side cross-sectional elevation view of a merged magnetic head 300, which includes a write head portion 302 and a read head portion 304, the read head portion employing a spin valve sensor 306. FIG. 3B is an ABS view of FIG. 3A. The spin valve sensor 306 is sandwiched between nonmagnetic electrically insulative first and second read gap layers 308 and 310, and the read gap layers are sandwiched between ferromagnetic first and second shield layers 312 and 314. In response to external magnetic fields, the resistance of the spin valve sensor 306 changes. A sense current (1%) conducted through the sensor causes these resistance changes to be manifested as potential changes. These potential changes may then be processed as readback signals by processing circuitry (e.g. processing circuitry of the control unit 129 shown in FIG. 1).

The write head portion 302 of the magnetic head 300 includes a coil layer 322 sandwiched between first and second insulation layers 316 and 318. Note that the coils 322 are only partially shown, additional portions thereof being present outside the diagram. A third insulation layer 320 may be employed for planarizing the head to eliminate ripples in the second insulation layer caused by the coil layer 322. The first, second and third insulation layers are referred to in the art as an "insulation stack".

The coil layer 322 and the first, second and third insulation layers 316, 318 and 320 are sandwiched between first and second pole piece layers 324 and 326. The first and second pole piece layers 324 and 326 are magnetically coupled at a back gap 328 and have first and second pole tips 330 and 332 which are separated by a write gap layer 334 at the ABS. Since the second shield layer 314 and the first pole piece layer 324 are a common layer this head is known as a merged head. In a piggyback head, an insulation layer is located between a second shield layer and a first pole piece layer. First and second solder connections (not shown) connect leads (not shown) from the spin valve sensor 306 to leads (not shown) on the slider 113 (FIG. 1), and third and fourth solder connections (not shown) connect leads (not shown) from the coil 322 to leads (not shown) on the suspension.

The inventor has found that by forming magnesium oxide tunnel barrier layers using (at least in part) natural oxidation, improvements in terms of performance and reliability can be achieved over magnesium oxide tunnel barrier layers formed exclusively by reactive deposition. Such improvements are both surprising and unpredictable. For example, several of the embodiments described herein have advantages over reactively deposited magnesium oxide formed, e.g., by sputtering from a metallic Mg target in the presence of oxygen, or RF sputtered magnesium oxide formed, e.g., by sputtering from a ceramic MgO target without presence or in the presence of oxygen, in that the TMR vs RA curve and TMR/RA vs RA curve are shifted to a lower RA regime. That means that for the same RA value the TMR value is higher, and more importantly the TMR/RA value is higher The teachings herein are also superior to deposition of a single, thick layer of metallic magnesium followed by natural oxidation, which technique fails to achieve good results, such as high TMR and low RA. Without wishing to be bound by any theory, it is believed that it is difficult if not impossible to uniformly oxidize relatively thick (e.g., >5 Å) magnesium.

Various embodiments of the present invention are directed to new Tunnel Magnetoresistance (TMR) systems, also known as magnetic tunnel junction (MTJ) systems. Other embodiments include methods of fabrication of such systems. The systems disclosed herein tend to exhibit at least one of an improved TMR/RA ratio, a lower interlayer coupling between the free layer and reference layer, and a higher breakdown voltage, relative to a tunnel barrier layer formed entirely by reactive deposition or RF sputtering. Again, such improvements are both surprising and unpredictable, as one would have expected results similar to formation by reactive oxidation regardless of whether layers were formed by natural oxidation or reactive oxidation.

The TMR systems disclosed herein have potential applications as magnetic field sensors. A basic TMR device comprises two ferromagnetic layers separated by a thin, electrically insulating, tunnel barrier layer. The tunnel barrier layer is sufficiently thin that quantum-mechanical tunneling of charge carriers occurs between the ferromagnetic layers. The tunneling process is electron spin dependent, which means that the tunneling current across the junction depends on the spin-dependent electronic properties of the ferromagnetic materials and is a function of the relative orientation of the magnetizations of the two ferromagnetic layers. In the TMR sensor, one ferromagnetic layer has its magnetization fixed, or pinned, and the other ferromagnetic layer has its magnetization free to rotate in response to an external magnetic field from the recording medium (the signal field). When an electric potential is applied between the two ferromagnetic layers, the sensor resistance is a function of the tunneling current across the insulating layer between the ferromagnetic layers. Since the tunneling current that flows perpendicularly through the tunnel barrier layer depends on the relative magnetization directions of the two ferromagnetic layers, recorded data can be read from a magnetic medium because the signal field causes a change of direction of magnetization of the free layer, which in turn causes a change in resistance of the TMR sensor and a corresponding change in the sensed current or voltage.

In the following description, the width of the layers refers to the track width. The sensor height is in a direction into the face of the paper. Unless otherwise described, thicknesses of the individual layers are taken perpendicular to the plane of the associated layer and parallel to the ABS, and are provided by way of example only and may be larger and/or smaller than those listed. Similarly, the materials listed herein are provided by way of example only, and one skilled in the art will understand that other materials may be used without straying from the spirit and scope of the present invention.

Figure 4:
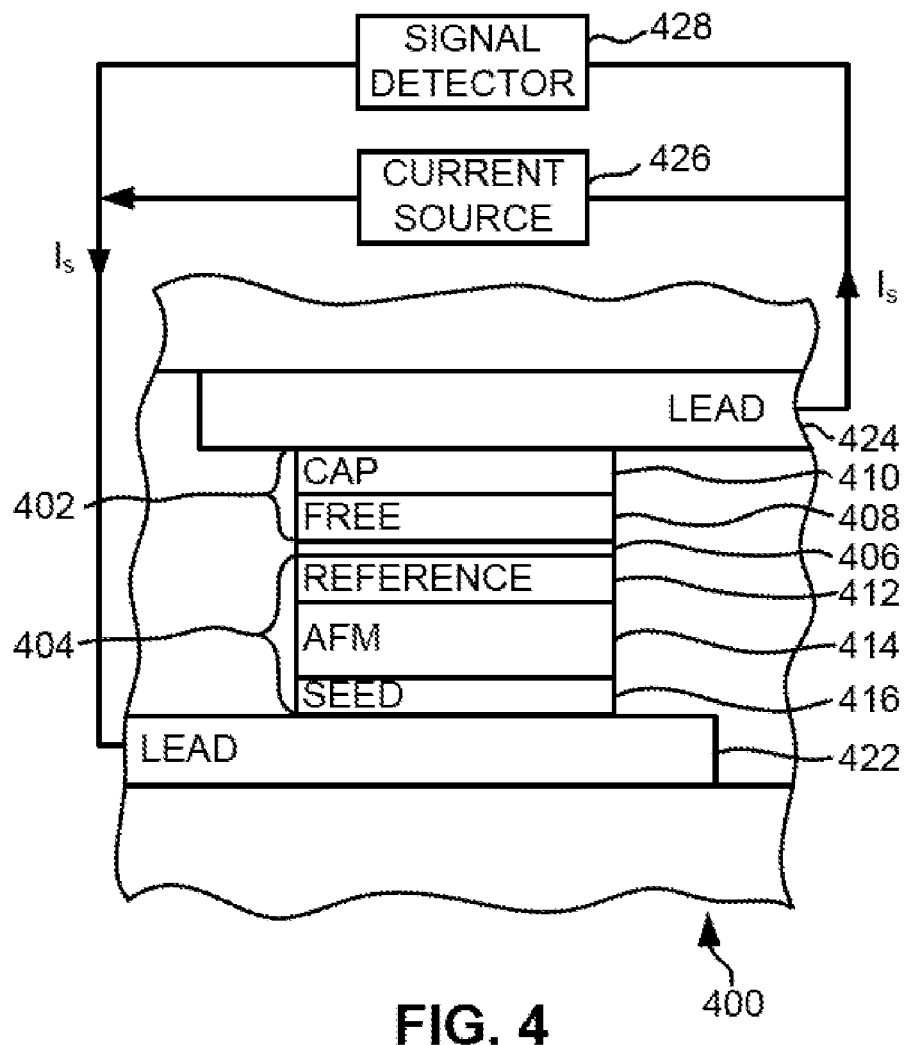
FIG. 4 is an air bearing surface view, not to scale, of a TMR sensor according to one embodiment.

FIG. 4 shows a simplified TMR sensor 400 comprising a first electrode 404, a second electrode 402, and a tunnel barrier layer 406. The first electrode 404 comprises a reference layer (pinned ferromagnetic layer) 412, an antiferromagnetic (AFM) layer 414, and a seed layer 416. The magnetization of the reference layer 412 is fixed through exchange coupling with the AFM layer 414. Further, the reference layer may be part of an antiparallel pinned layer structure of a type known in the art. The second electrode 402 comprises a free layer (free ferromagnetic layer) 408 and a cap layer 410. The free layer 408 is separated from the reference layer 412 by a nonmagnetic, electrically insulating tunnel barrier layer 406. In the absence of an external magnetic field, the free layer 408 has its magnetization oriented in a direction that is generally perpendicular to the magnetization direction of the reference layer 412. A first lead 422 and a second lead 424 formed in contact with first electrode 404 and second electrode 402, respectively, provide electrical connections for the flow of sensing current is from a current source 426 to the TMR sensor 400. Because the sensing current is perpendicular to the plane of the sensor layers, the TMR sensor 400 is known as a current-perpendicular-to-plane (CPP) sensor. A signal detector 428, typically including a recording channel such as a partial-response maximum-likelihood (PRML) channel, connected to the first and second leads 422 and 424 senses the change in resistance due to changes induced in the free layer 408 by the external magnetic field. As will be understood by those skilled in the art, the sensor 400 may have additional layers, fewer layers, and/or other types of layers may be substituted for some of those shown.

As noted above, the tunnel barrier layer is formed at least in part by natural oxidation of magnesium. Natural oxidation occurs by exposing an oxidizable layer, here of magnesium, to an oxidizing environment. Illustrative oxidizing environments include, but are not limited to, gaseous oxygen, ozone, etc. An illustrative natural oxidation process is described below.

Accordingly, the completed tunnel barrier layer has microstructure and composition characteristic of in situ naturally oxidized magnesium. Such characteristic microstructure and composition of magnesium oxide can have a decreasing ratio of oxidized magnesium to unoxidized magnesium from a top of the layer to a bottom of the layer, or different grain size and/or texture compared to microstructure and composition of reactively sputtered magnesium oxide.

Figure 6:
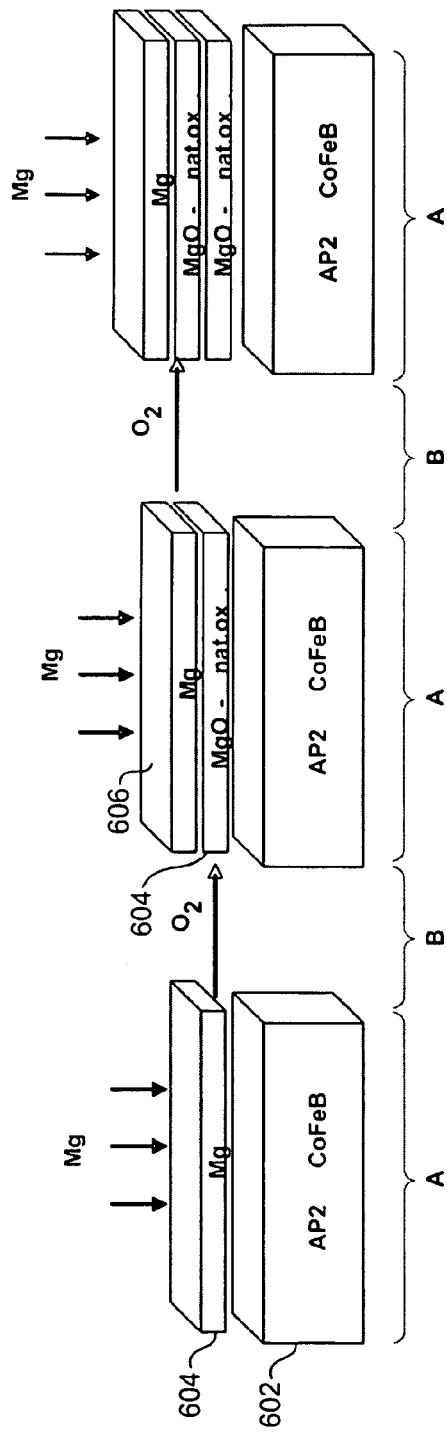
FIG. 6 graphically depicts an illustrative method for forming a multilayer tunnel barrier layer according to one embodiment.
Figure 7:
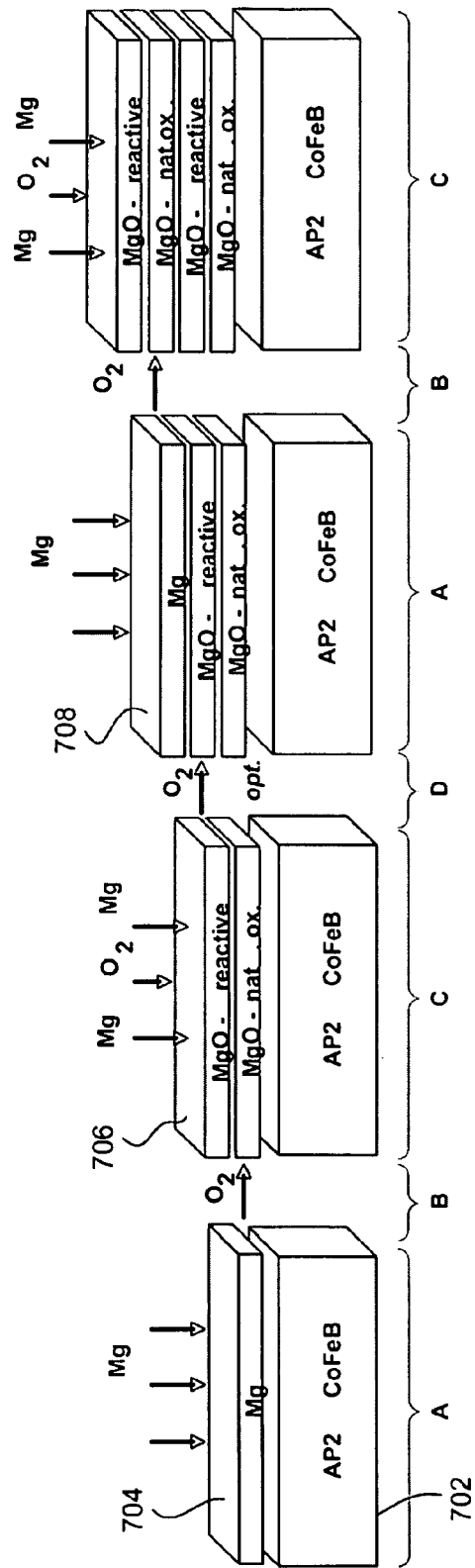
FIG. 7 graphically depicts a method for forming a multilayer tunnel barrier layer according to another embodiment.

It should be noted that the highest TMR, lowest RA and lowest interlayer coupling (Hf) are believed to be achieved if the magnesium sub-layers which are naturally oxidized are thin (e.g., about 2 Å to about 4 Å) and desired barrier thickness or desired RA level is built in steps as shown in FIG. 6 and FIG. 7. For such thin magnesium sub-layers, natural oxidation is capable of fully oxidizing the magnesium sub-layer thickness without damaging the layer which is deposited prior to the barrier layer, e.g., reference layer (in case of bottom tunnel valve), or free layer (in case of top tunnel valve).

The tunnel barrier layer is preferably a multilayer structure of individual layers of magnesium oxide, at least one of which is formed by natural oxidation and thus has microstructure and composition characteristic of in situ naturally oxidized magnesium. In one approach, all of the layers of the tunnel barrier layer are formed by natural oxidation. In another approach, one or more of the layers of the tunnel barrier layer is formed by reactive deposition, and thus has microstructure and composition characteristic of reactively sputtered magnesium oxide. An illustrative reactive oxidation process is described below.

Each of the layers of a multilayer tunnel barrier layer is preferably less than about 4 angstroms thick, and more preferably less than about 3 angstroms thick (and greater than 0 angstroms thick), e.g., about 2 to about 3 angstroms thick. However, the layers may be thicker or thinner. Further, the layers need not all have the same thickness, though they could.

The tunnel barrier layer itself may have a thickness of less than about 10 angstroms (and greater than 0 angstroms thick). Preferably, the tunnel barrier layer has a thickness of less than about 8 angstroms.

A generic thin film stack for a bottom tunnel valve may be as follows: bottom lead/seed/antiferromagnetic layer (AFM)/first antiparallel layer (AP1-keeper)/antiparallel coupling layer (APC)/second antiparallel layer (AP2-reference)/barrier/free layer/cap/top lead. A generic thin film stack for a top tunnel valve may be as follows: lead/seed/free layer/barrier/AP2/APC/AP1/AFM/cap/top lead To exemplify a bottom tunnel valve embodiment, and also to describe illustrative compositions and thicknesses of layers that may be found in some embodiments, reference is made to FIG. 5.

Figure 5:
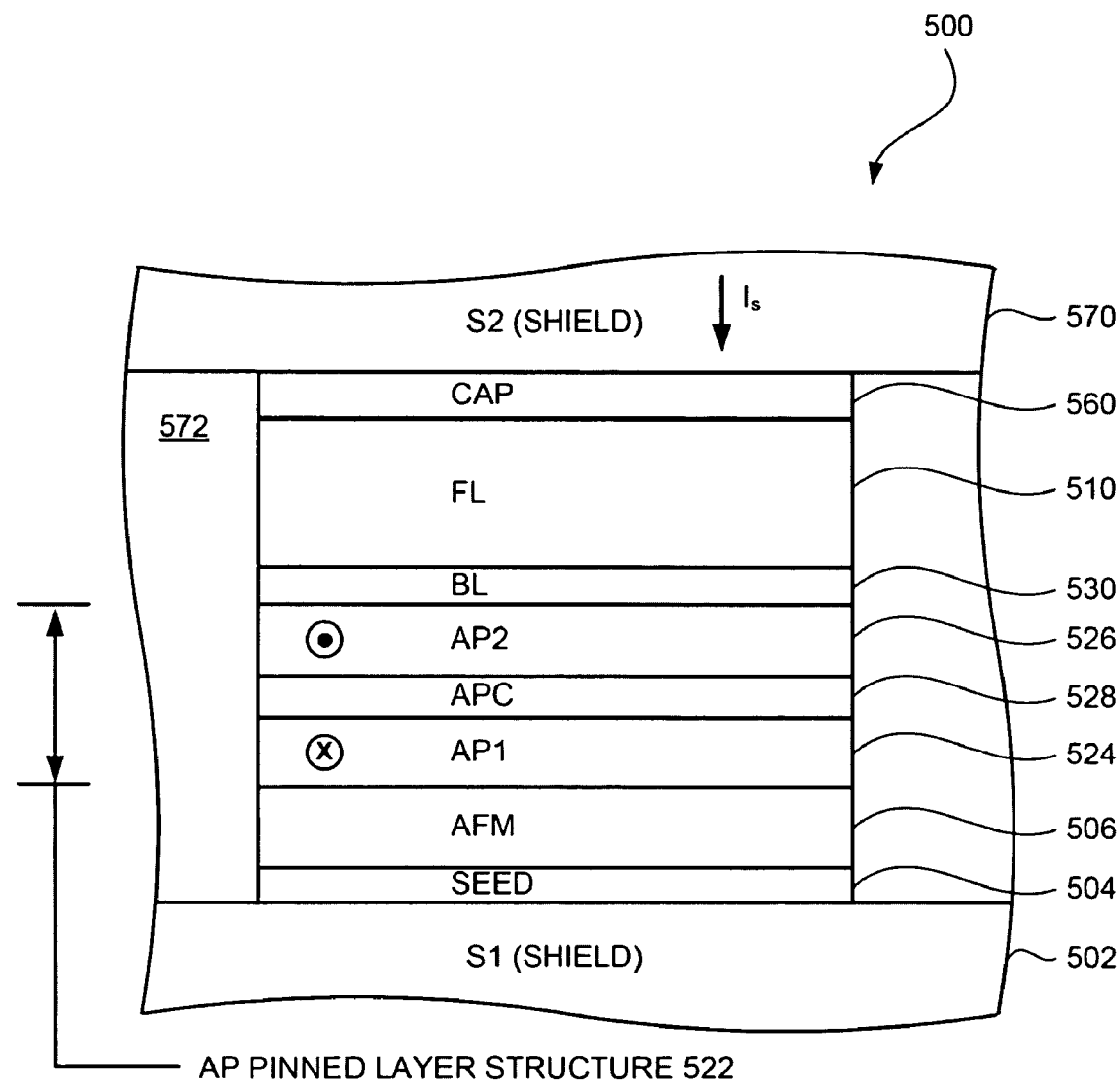
FIG. 5 is an air bearing surface view, not to scale, of a TMR sensor according to an embodiment of the present invention.

FIG. 5 shows an air bearing surface (ABS) view, not to scale, of a TMR sensor 500 according to a preferred embodiment of the present invention. As shown in FIG. 5, a first shield layer (S1) 502 is formed on a substrate (not shown). The first shield layer 502 can be of any suitable material, such as permalloy (NiFe), and may function as a lead.

Seed layers 504 are formed on the first shield layer 502. The seed layers 504 aid in creating the proper growth structure of the layers above them. Illustrative materials formed in a stack from the first shield layer 502 are a layer of Ta and a layer of NiFeCr and a layer of NiFe. Illustrative thicknesses of these materials are Ta (30 Å), NiFeCr (20 Å) and NiFe (8 Å). Note that the stack of seed layers 504 can be varied, and layers may be added or omitted based on the desired processing parameters.

An antiferromagnetic (AFM) layer 506, e.g., of IrMn or IrMnCr, may be formed above the seed layers 504. An AP pinned layer structure 522 is formed above the seed layers 504, and AFM 506 if present. The first pinned layer (AP1) 524, e.g., of CoFe, is the keeper layer, while the second pinned layer (AP2) 526, e.g., of CoFeB is the reference layer. An APC layer 528, e.g., of Ru, is positioned between AP1 524 and AP2 526. This magnetic coupling through the APC 528 causes the pinned layers 524, 526 to have antiparallel-oriented magnetizations.

The keeper layer (AP1) magnetization is strongly pinned by antiferromagnetic (AFM) pinning layer. Keeper layer (AP1) magnetization direction is set perpendicular to the ABS (along the height of the sensor). This is done by performing a pinning anneal, e.g., heating AFM/AP1 couple above its Neel temperature to T=240-280° C., soaking for 3-10 hr and cooling to room temperature in the presence of strong magnetic field (15-50 kOe) perpendicular to the ABS.

Illustrative materials for the AP1 and AP2 pinned layers are $CoFe_{25}$ (75% Co, 25% Fe) and $CO_{51}Fe_{34}B_{15}$, etc. Illustrative thicknesses of the pinned layers 524 and 526 are between about 10 Å and 30 Å. The AP coupling layer 528 can be formed of Ru at a thickness of about 4-8.5 Å, but is preferably selected to provide a saturation field above about 5 kOe. In a preferred embodiment, each of the AP pinned layers 524, 526 is about 20 Å with an Ru layer 528 therebetween of about 4.5 Å.

In typical heads, the AP pinned layer structure 522 is stabilized by an antiferromagnetic (AFM) layer 506 adjacent the pinned layer structure 522. The AFM layer pins the AP pinned layer structure 522 so that the pinned layers 524, 526 do not move around when disk is reading data from disk, upon application of external magnetic fields, etc. The AFM layer may be about 45-65 Å thick, or higher or lower.

A barrier layer (BL) 530 is formed of magnesium oxide. The barrier layer 530 is very thin such that the electric current passing through the sensor 500 "tunnels" through the spacer layer 530. An illustrative thickness of the barrier layer 530 is 6-8 Å.

A free layer (FL) 510 is formed above the barrier layer 530 in case of the bottom tunnel valve, which is a preferred embodiment. In a top tunnel valve, the free layer is formed above the seed layer and below the barrier layer. The free layer 510 is magnetically soft and so is susceptible to reorientation from external magnetic forces, such as those exerted by data on disk media. The relative motion of magnetic moment of the free layer 510 when affected by data bits on disk media creates variations in the sensing current flowing through the sensor 500, thereby creating the signal. Preferred materials for the free layer 510 are CoFe/CoFeB but can also be formed of a CoFe/CoFeB/NiFe etc. An illustrative thickness of the free layer 510 is about 10-40 Å.

A cap (CAP) 560 is formed above the free layer 510. Exemplary materials for the cap 560 are Ru/Ta, Ta/Ru etc. An illustrative thickness of the cap 560 is 30-100 Å.

A second shield layer (S2) 570 is formed above the cap 560. An electrically insulative material 572 such as $Al_2O_3$ is formed on both sides of the sensor 500.

FIG. 6 graphically depicts an illustrative method for forming a multilayer tunnel barrier layer according to one embodiment. As shown in step A, a first layer of magnesium 604 is formed on a substrate 602, which in this case is a reference layer from an AP pinned layer structure (bottom tunnel valve). In other embodiments, the substrate may be a free layer (top tunnel valve). Next, in step B, the first layer 604 of magnesium is exposed to an oxidizing environment for causing oxidation of the first layer 604 of magnesium. Particularly, the Mg is transformed to MgO by oxidizing from the top originally pure Mg layer deposited in step A.

The process may stop here for a single layer tunnel barrier layer, or additional layers can be added. For example, steps may be repeated. As shown, step A is repeated to form a second layer 606 of magnesium above the oxidized first layer 604 of magnesium, and the second layer 606 of magnesium is exposed to the oxidizing environment for causing oxidation of the second layer 606 of magnesium. Preferably, the oxidizing environment is removed from a vicinity of the first layer prior to forming the second layer of magnesium. This may be accomplished by evacuating the deposition chamber, flushing the chamber with an inert substance such as an inert gas, etc.

As further exemplified by FIG. 6, third and additional layers of magnesium and/or magnesium oxide can be added using similar steps as in steps A and B.

The magnesium oxide layer(s) can be formed by depositing a magnesium (Mg) film with DC-magnetron sputtering from a pure magnesium target in an inert atmosphere, e.g., of argon gas, and then exposing the thus formed layer to an oxygen-containing gas. Other modes of deposition may also be used, such as ion beam deposition, evaporation, etc. In one approach, gaseous oxygen is supplied to the chamber at >0 to about 5 standard cubic centimeters per minute (sccm) for >0 to about 90 seconds. Then the chamber is evacuated and the process repeated (if desired). This optimum in situ oxidation is incorporated into this magnesium oxide formation process for attaining a high tunneling magnetoresistance and low junction resistance.

FIG. 7 illustrates another method for forming a multilayer tunnel barrier layer according to one embodiment. As shown in step A, a first layer of magnesium 704 is formed on a substrate 702, which may be a free layer or reference layer. Next, in step B, the first layer 704 of magnesium is exposed to an oxidizing environment for causing oxidation of the first layer 704 of magnesium.

Next, as shown in step C, a layer 706 of magnesium oxide is formed above the oxidized first layer 702 of magnesium. This layer 706, however, is formed by reactive deposition of magnesium, i.e., magnesium is deposited in the presence of oxygen and layer 706 is growing as a magnesium oxide. This is in contrast to layer 704 which is growing as a magnesium in step A and then is transformed to magnesium oxide by natural oxidation in step B.

As an option, exemplified by step D, the reactively grown magnesium oxide layer 706 may be also exposed to an oxidizing environment.

The process may stop here, or additional layers can be added. For example, as shown in repeated step A, another layer 708 of magnesium is formed above layer 706, and layer 708 is exposed to the oxidizing environment for causing oxidation thereof.

Preferably, the oxidizing environment is removed from the chamber between deposition of the various layers. This may be accomplished by evacuating the deposition chamber, flushing the chamber with an inert substance such as an inert gas, etc.

Figure 7A:
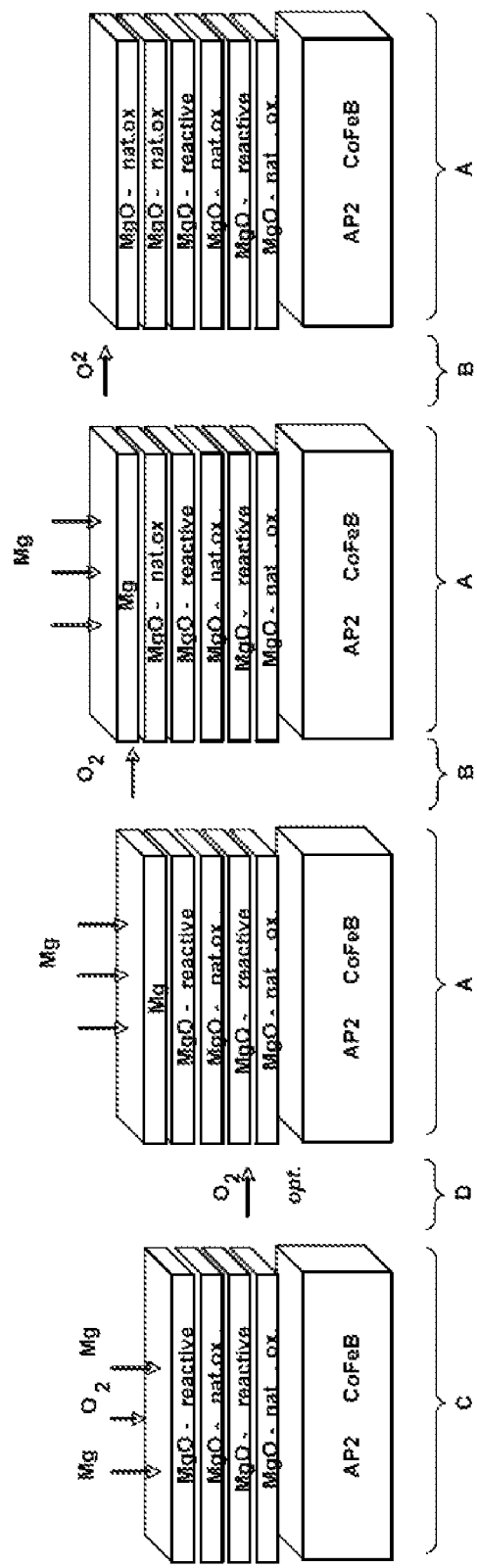
FIG. 7A graphically depicts a method for forming a multilayer tunnel barrier layer according to another embodiment.
Figure 7B:
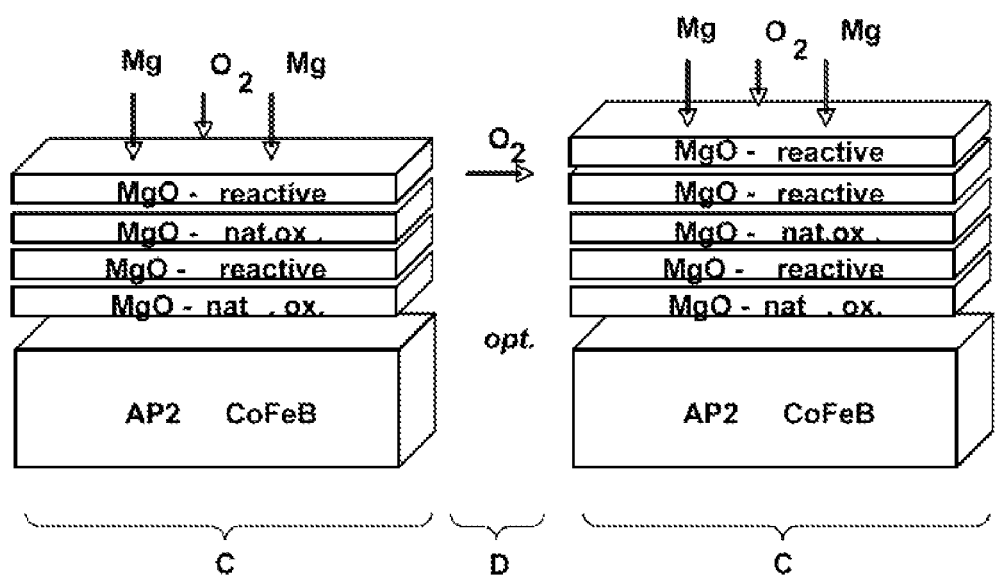
FIG. 7B graphically depicts a method for forming a multilayer tunnel barrier layer according to another embodiment.

As further exemplified by FIGS. 7A and 7B, third and additional layers of magnesium and/or magnesium oxide can be added using similar steps as in steps A. B, C and/or D.

Note that the layers can be rearranged. For instance, the layer formed by reactive oxidation could be formed first or last. Further, multiple layers formed by natural oxidation can be formed adjacent to one another. Likewise, multiple layers formed by reactive oxidation can be formed adjacent to one another.

TMR sensors can be fabricated in an integrated ion beam/DC magnetron sputtering system to sequentially deposit the various layers of the structure, in addition to the tunnel barrier layer. For example, an integrated ion beam/DC magnetron sputtering system may be used to form the multilayer structures shown in FIGS. 4 and 5.

Figure 8:
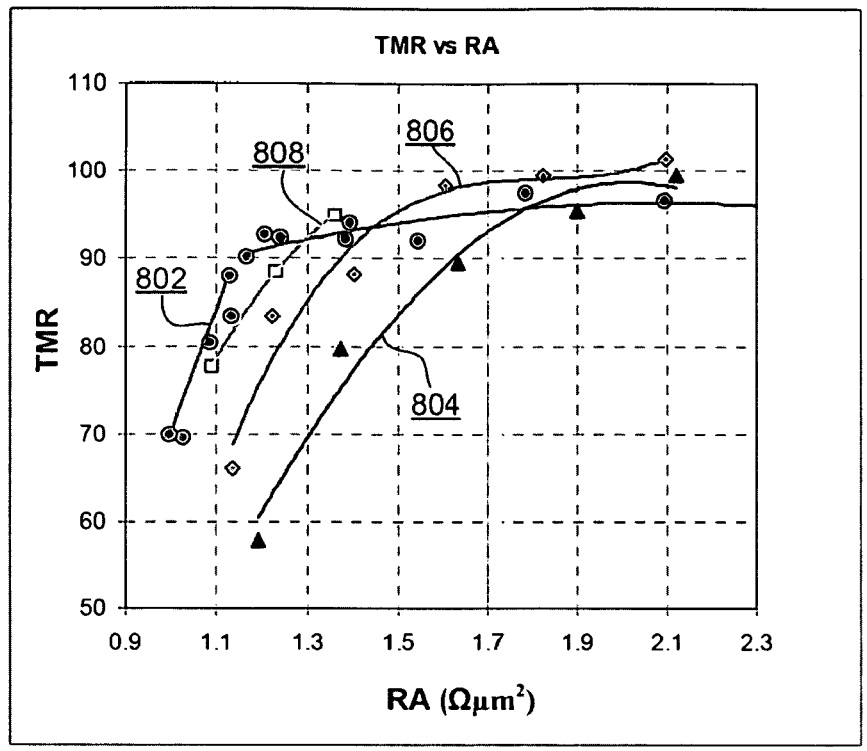
FIG. 8 is a chart depicting tunneling magnetoresistance (TMR) versus the resistance area product (RA) for various types of magnesium oxide tunnel barrier layers.

FIG. 8 is a chart depicting tunneling magnetoresistance (TMR) versus the resistance area product (RA) for various types of magnesium oxide tunnel barrier layers. The various tunnel barrier layers represented include a tunnel barrier layer formed by natural oxidation (802), a tunnel barrier layer formed by reactive oxidation (804), a hybrid tunnel barrier layer having layers formed by both natural and reactive oxidation (806), and a tunnel barrier layer having a layer of magnesium (substantially unoxidized) and a layer of magnesium oxide formed by reactive oxidation (808).

It is noted that a high TMR and low RA are desirable for both high signal to noise ratio as well as reliability. As shown, the tunnel barrier layer formed by natural oxidation (802) exhibits the best balance of high TMR and low RA.

Figure 9:
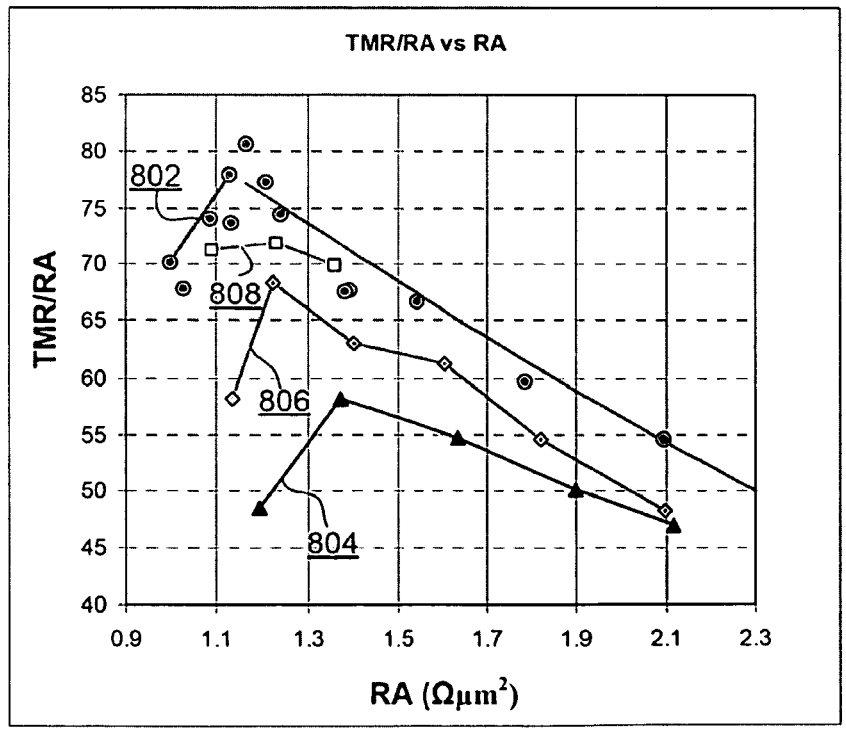
FIG. 9 is a chart depicting TMR/RA versus RA for the various types of magnesium oxide tunnel barrier layers.

This can be better seen in FIG. 9 which is a chart depicting TMR/RA versus RA for the various types of magnesium oxide tunnel barrier layers discussed above with reference to FIG. 8. It is noted that a high TMR/RA is desirable for achieving a high signal to noise ratio. As shown, the tunnel barrier layer formed by natural oxidation (802) exhibits the highest TMR/RA. Accordingly, as shown, the TMR/RA ranking of the layers is in the following order: layer formed by natural oxidation (802), layer of Mg/MgO by reactive deposition (808), hybrid layer (806), and layer formed by reactive deposition (804).

Figure 10:
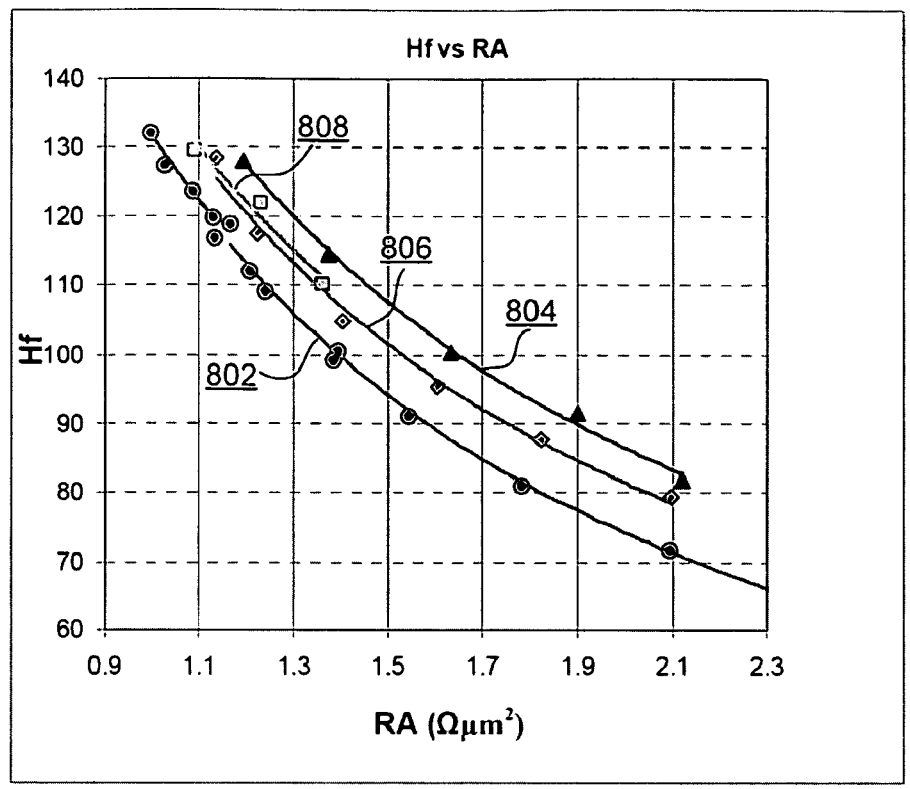
FIG. 10 is a chart depicting the interlayer coupling (Hf) between free layer and reference layer versus RA for the various types of magnesium oxide tunnel barrier layers.

FIG. 10 is a chart depicting the interlayer coupling (Hf) between free layer and reference layer versus RA for the various types of magnesium oxide tunnel barrier layers discussed above with reference to FIG. 8. It is noted that a low coupling (Hf) is desirable for reducing asymmetry. It should also be pointed out that Hf, as well as RA, are functions of the physical thickness of the tunnel barrier layer. In general, the thinner the barrier layer, the lower the RA, but the higher the Hf. Therefore, it may be desirable to achieve a balance between RA and Hf.

As shown in FIG. 10, the tunnel barrier layer formed by natural oxidation (802) exhibits the lowest Hf for given RA. The Hf ranking of the layers is in the following order: layer formed by natural oxidation (802), layer of Mg/MgO by reactive deposition (808) and hybrid layer (806) are about the same, and layer formed by reactive deposition (804).

Figure 11:
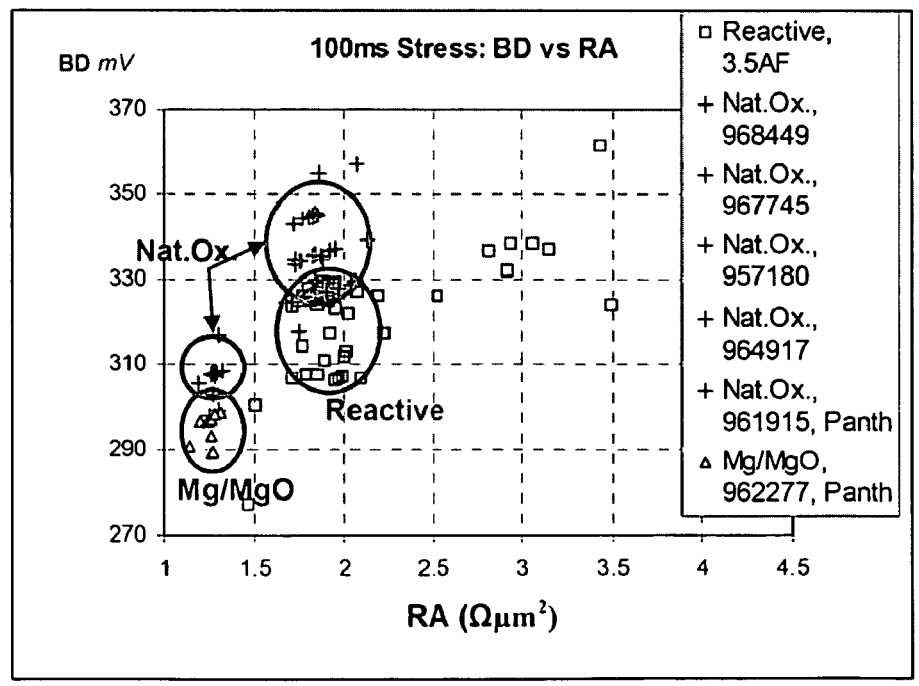
FIG. 11 is a chart depicting the breakdown voltage (BD) versus RA for various types of magnesium oxide tunnel barrier layers.

FIG. 11 is a chart depicting the breakdown voltage (BD) versus RA for various types of magnesium oxide tunnel barrier layers when the stress current is applied for 100 ins. The breakdown voltage generally refers to the voltage at which the tunnel barrier layer fails. The various tunnel barrier layers represented include a tunnel barrier layer formed by natural oxidation (+), a tunnel barrier layer formed by reactive oxidation (□), and a tunnel barrier layer having a layer of magnesium (substantially unoxidized) and a layer of magnesium oxide formed by reactive oxidation (Δ). It is noted that high BD is desirable for reliability. As shown, the tunnel barrier layers formed by natural oxidation (+) exhibit the highest BD. The inventor estimates that the tunnel barrier layer formed by natural oxidation has about a 25±10 mV higher BD voltage than a tunnel barrier layer formed by reactive deposition. Similarly, the inventor estimates that the tunnel barrier layer formed by natural oxidation has about a 15±10 mV higher BD voltage than a tunnel barrier layer having a layer of Mg and a layer of MgO formed by reactive deposition.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A system, comprising:
    a free layer; and
    a tunnel barrier layer having microstructure and composition characteristic of in situ natural oxidation of magnesium,
    wherein the tunnel barrier layer is a multilayer structure of individual layers of magnesium oxide stacked directly upon one another,
    a first plurality of the layers of the tunnel barrier layer having microstructure and composition characteristic of in situ naturally oxidized magnesium,
    a second plurality of the layers of the tunnel barrier layer having microstructure and composition characteristic of reactive deposition of magnesium in the presence of oxygen,
    wherein the first plurality of the layers is interleaved with the second plurality of the layers.

2. A system as recited in claim 1, wherein each of the layers of the tunnel barrier layer is less than about 4 angstroms thick and greater than 0 angstroms thick.

3. A system as recited in claim 1, wherein the tunnel barrier layer is less than about 9 angstroms thick and greater than 0 angstroms thick.

4. A system as recited in claim 1, further comprising:
    magnetic media;
    at least one head for reading from and writing to the magnetic media, each head having:
        a sensor comprising the free layer and the tunnel barrier layer;
        a writer coupled to the sensor;
    a slider for supporting the head; and
    a control unit coupled to the head for controlling operation of the head.

5. A system as recited in claim 1, further comprising a third layer of the tunnel barrier layer, the third layer being a discretely formed layer of magnesium oxide having microstructure and composition characteristic of in situ naturally oxidized magnesium, the third layer being directly adjacent one of the layers in the first plurality of layers of the tunnel barrier layer.

6. A system as recited in claim 1, further comprising a third layer of the tunnel barrier layer, the third layer being a discretely formed layer of magnesium oxide having microstructure and composition characteristic of reactive deposition of magnesium in the presence of oxygen, the third layer being directly adjacent one of the layers in the second plurality of layers of the tunnel barrier layer.

7. A method for forming a system as recited in claim 1, the method comprising:
    forming a first layer of magnesium above at least one of the free layer and a reference layer;
    exposing the first layer of magnesium to an oxidizing environment for causing oxidation of the first layer of magnesium;
    forming a second layer of magnesium above the oxidized first layer of magnesium; and
    exposing the second layer of magnesium to the oxidizing environment for causing oxidation of the second layer of magnesium.

8. A method as recited in claim 7, further comprising removing the oxidizing environment, from a vicinity of the first layer prior to forming the second layer of magnesium.

9. A method as recited in claim 7, further comprising forming a layer of magnesium oxide by reactive deposition above the oxidized first layer of magnesium.

10. A method as recited in claim 9, further comprising forming the second layer of magnesium above the oxidized first layer of magnesium and the layer of magnesium oxide formed by reactive deposition, and exposing the second layer of magnesium to the oxidizing environment for causing oxidation of the second layer of magnesium.

11. A method as recited in claim 10, further comprising removing the oxidizing environment from a vicinity of the first layer prior to forming the layer of magnesium oxide by reactive deposition.

12. A method as recited in claim 7, further comprising forming a layer of magnesium oxide by reactive deposition above the oxidized second layer of magnesium.

13. A method as recited in claim 7, wherein at least one of the layers of magnesium is formed by sputtering.

14. A method as recited in claim 7, wherein the oxidizing environment includes gaseous oxygen.

15. A method as recited in claim 7, wherein the first layer of magnesium is less than about 3 angstroms thick and greater than 0 angstroms thick.

16. A method for forming a system as recited in claim 1, the method comprising:
    forming a first layer of magnesium above at least one of a free layer and a reference layer;
    exposing the first layer of magnesium to an oxidizing environment for causing oxidation of the first layer of magnesium; and
    forming a layer of magnesium oxide above the at least one of the free layer and the reference layer by reactive deposition.

17. A method as recited in claim 16, further comprising forming a second layer of magnesium oxide by reactive deposition above the oxidized first layer of magnesium.

18. A method as recited in claim 16, further comprising removing the oxidizing environment from a vicinity of the first layer of magnesium prior to forming a subsequent layer.

19. A method as recited in claim 18, further comprising forming a second layer of magnesium above the layer of magnesium oxide formed by reactive deposition, and exposing the second layer of magnesium to the oxidizing environment for causing oxidation of the second layer of magnesium.

20. A method as recited in claim 16, wherein the layer of magnesium oxide formed by reactive deposition is formed above the oxidized first layer of magnesium.

21. A method as recited in claim 16, wherein the oxidizing environment: includes gaseous oxygen.

22. A method as recited in claim 16, wherein the first layer of magnesium is less than about 3 angstroms thick and greater than 0 angstroms thick.

* * * * *

UNITED STATES PATENT AND TRADEMARK OFFICE
CERTIFICATE OF CORRECTION

PATENT NO.       : 8,373,948 B2
APPLICATION NO.  : 12/110681
DATED            : February 12, 2013
INVENTOR(S)      : Alexander M. Zeltser It is certified that error appears in the above-identified patent and that said Letters Patent is hereby corrected as shown below:

In the specification:

col. 5, line 22 replace "(1%)" with --($I_s$)--;

col. 7, line 6 replace "is" with --($I_s$)--.

Signed and Sealed this
Twenty-first Day of May, 2013

Teresa Stanek Rea
*Acting Director of the United States Patent and Trademark Office*